(12) United States Patent
Pawlak et al.

(10) Patent No.: US 9,601,379 B1
(45) Date of Patent: Mar. 21, 2017

(54) METHODS OF FORMING METAL SOURCE/DRAIN CONTACT STRUCTURES FOR SEMICONDUCTOR DEVICES WITH GATE ALL AROUND CHANNEL STRUCTURES

(71) Applicants: GLOBALFOUNDRIES Inc., Grand Cayman (KY); IMEC VZW, Leuven (BE)

(72) Inventors: Bartlomiej Jan Pawlak, Leuven (BE); Dmitry Yakimets, Moscow region (RU); Pieter Schuddinck, Belgium (DE)

(73) Assignees: GLOBALFOUNDRIES Inc., Grand Cayman (KY); IMEC VZW, Leuven (BE)

( * ) Notice: Subject to any disclaimer, the term of this patent is extended or adjusted under 35 U.S.C. 154(b) by 0 days.

(21) Appl. No.: 14/757,996

(22) Filed: Dec. 23, 2015

(51) Int. Cl.
| | |
|---|---|
| *H01L 29/06* | (2006.01) |
| *H01L 21/8234* | (2006.01) |
| *H01L 21/265* | (2006.01) |
| *H01L 21/306* | (2006.01) |
| *H01L 21/3065* | (2006.01) |
| *H01L 21/308* | (2006.01) |
| *H01L 29/423* | (2006.01) |

(Continued)

(52) U.S. Cl.
CPC ......... *H01L 21/823418* (2013.01); *H01L 21/26513* (2013.01); *H01L 21/3065* (2013.01); *H01L 21/3081* (2013.01); *H01L 21/30608* (2013.01); *H01L 21/823431* (2013.01); *H01L 23/53214* (2013.01); *H01L 23/53228* (2013.01); *H01L 23/53242* (2013.01); *H01L 23/53257* (2013.01); *H01L 27/0886* (2013.01); *H01L 29/0673* (2013.01); *H01L 29/42392* (2013.01)

(58) Field of Classification Search
None
See application file for complete search history.

(56) References Cited

U.S. PATENT DOCUMENTS

| | | | |
|---|---|---|---|
| 8,994,108 B2 * | 3/2015 | Chang ................. | H01L 29/78 257/347 |
| 2012/0009749 A1 * | 1/2012 | Tan .................... | B82Y 10/00 438/284 |
| 2014/0159159 A1 | 6/2014 | Steigerwald et al. | |

(Continued)

OTHER PUBLICATIONS

Yakimets et al., "Lateral NWFET Optimization for Beyond 7nm Nodes," Jun. 1, 2015.

*Primary Examiner* — Ali Naraghi
(74) *Attorney, Agent, or Firm* — Amerson Law Firm, PLLC

(57) ABSTRACT

In one example, the method disclosed herein includes, among other things, forming a sacrificial structure around a plurality of stacked substantially un-doped nanowires at a location that corresponds to the channel region of the device, performing a selective etching process through a cavity to remove a second plurality of nanowires from the channel region and the source/drain regions of the device while leaving a first plurality of nanowires in position, and forming a metal conductive source/drain contact structure in each of the source/drain regions, wherein each of the metal conductive source/drain contact structures is positioned all around the first plurality of nanowires positioned in the source/drain regions.

16 Claims, 19 Drawing Sheets

(51) Int. Cl.
*H01L 23/532* (2006.01)
*H01L 27/088* (2006.01)

(56) References Cited

U.S. PATENT DOCUMENTS

2015/0380481 A1* 12/2015 Cappellani .............. H01L 21/76
257/499

* cited by examiner

METHODS OF FORMING METAL SOURCE/DRAIN CONTACT STRUCTURES FOR SEMICONDUCTOR DEVICES WITH GATE ALL AROUND CHANNEL STRUCTURES

BACKGROUND OF THE INVENTION

1. Field of the Invention

Generally, the present disclosure relates to the manufacture of sophisticated semiconductor devices, and, more specifically, to various methods of forming metal source/drain contact structures for semiconductor devices with gate all around channel structures.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, omega gate devices, gate-all-around (GAA) devices, such as nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Device manufacturers are under constant pressure to produce integrated circuit products with increased performance and lower production costs relative to previous device generations. For example, nanowire devices with multiple vertically stacked nanowires, e.g., 2, 3 or 4 nanowires, etc., in the channel region have been developed in an effort to increase the drive current of nanowire devices as compared to the drive current produced by previous nanowire devices that only had a single nanowire structure in the channel region of the device. For example, as compared to a single nanowire device, a nanowire device with three stacked nanowires would be expected to produce a drive current that is approximately three times that of the single nanowire device. However, this anticipated increase in the overall electrical performance of such multiple nanowire devices has not been achieved in practice. It is believed that at least one factor that limits the performance of such multiple nanowire devices is the configuration and/or materials used for the structures that provide electrical contact to the source/drain regions of such multiple nanowire devices.

The present disclosure is directed to various methods of forming metal source/drain contact structures for semiconductor devices with gate all around channel structures that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming metal source/drain contact structures for semiconductor devices with gate all around channel structures. In one example, the method disclosed herein includes, among other things, forming a plurality of stacked substantially un-doped nanowire structures above a semiconductor substrate, forming a sacrificial structure around the plurality of stacked substantially un-doped nanowires at a location that corresponds to the channel region of the device, forming a layer of insulating material above and adjacent the plurality of stacked substantially un-doped nanowires and proximate the sacrificial structure and removing the sacrificial structure to define a cavity that exposes the plurality of stacked substantially un-doped nanowires within the cavity. In this particular example, the method further includes performing a selective etching process through the cavity to remove a second plurality of nanowires from the channel region and the source/drain regions of the device while leaving a first plurality of nanowires in position, forming a metal conductive source/drain contact structure in each of the source drain regions, wherein each of the metal conductive source/drain contact structures is positioned all around the first plurality of nanowires positioned in the source/drain region and forming a gate all around gate structure that is positioned all around each of the first plurality of nanowires positioned in the channel region of the device.

One illustrative device disclosed herein includes, among other things, a channel region, a plurality of source/drain regions, a nanowire positioned in the channel region and in the source/drain regions, and a gate all around gate structure that is positioned all around the nanowire in the channel region of the device. In this example, the device also includes a metal conductive source/drain contact structure in each of the source drain regions, wherein each of the metal conductive source/drain contact structures is positioned all around the nanowires positioned in the source/drain region, a gate contact that is conductively coupled to the gate all around gate structure and a plurality of source/drain contact structures, each of which is conductively coupled to one of the metal conductive source/drain contact structures.

BRIEF DESCRIPTION OF THE DRAWINGS

The disclosure may be understood by reference to the following description taken in conjunction with the accompanying drawings, in which like reference numerals identify like elements, and in which.

Figure 1A:
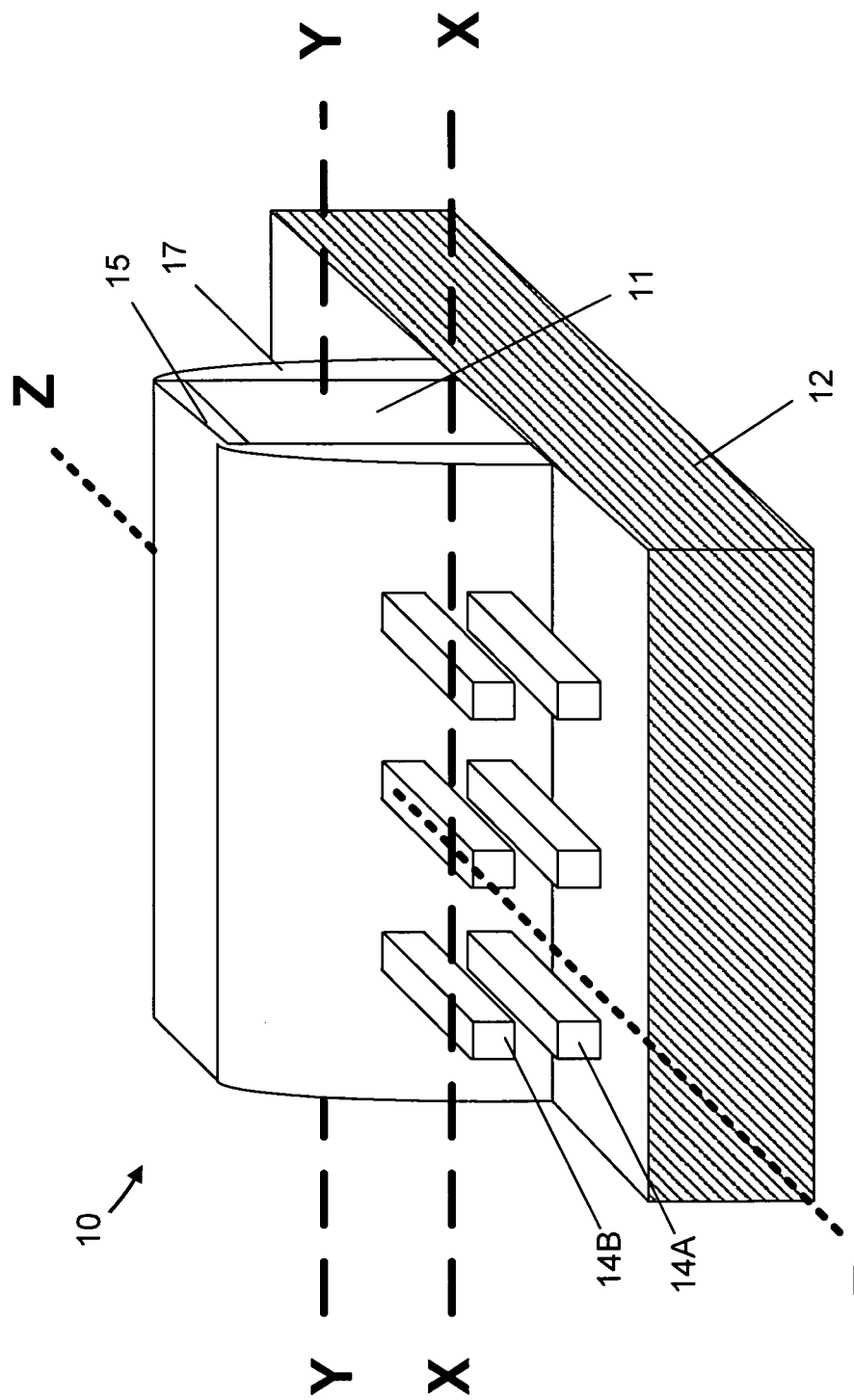
FIGS. 1A-1S depict various illustrative methods disclosed herein for metal source/drain contact structures for semiconductor devices with gate all around channel structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to forming a 3-D semiconductor device 10, wherein the gate structure is comprised of one or more nanowire structures (generally referred to herein using the reference number 14) stacked vertically above one another in the channel region of the device 10. The term "nanowire" is used herein and in the attached claims in a generic sense in that the term "nanowire" is intended to cover a channel structure having any type of cross-sectional configuration (in a view taken through the channel structure in the gate wide direction of the device), e.g., circular, elliptical, rectangular, square, etc. For ease of illustration, and by way of example only, the nanowire structures 14 depicted herein have a generally square cross-sectional configuration, but they may have a more rounded configuration in a real-world device at some point in the process flow. In the example described herein, the gate structure of the device 10 is depicted as being comprised of two illustrative nanowires 14. However, after a complete reading of the present application, those skilled in the art will appreciate that the gate structure may be comprised of any desired number of such nanowire structures and in some cases may be comprised of only a single nanowire structure. Thus, the inventions disclosed herein should not be considered as being limited to a device with any particular number of such nanowire structures. Moreover, as will be readily apparent to those skilled in the art upon a complete reading of the present application, the present method is applicable to a variety of devices, including, but not limited to, logic devices, memory devices, etc.

FIG. 1A is a perspective view of an illustrative gate-all-around (GAA) nanowire semiconductor device 10 at an early stage of manufacturing that is formed above a semiconducting substrate 12. The substrate 12 may have a variety of configurations, such as the depicted bulk substrate configuration. The substrate 12 may be made of silicon or it may be made of materials other than silicon. Thus, the terms "substrate" or "semiconducting substrate" should be understood to cover all semiconducting materials and all forms of such materials.

The illustrative device 10 includes a plurality of nanowires 14A, 14B (generally or collectively referred to using the reference number 14), a GAA gate structure 11, a sidewall spacer 17 and a gate cap layer 15. FIG. 1A depicts the locations where various cross-sectional views of the device 10 will be taken in the drawings discussed below. More specifically, view "X-X" is a cross-sectional view taken through the nanowires 14 in a direction that is transverse to the long axis of the nanowires 14, and the view X-X is taken through what will become the source/drain regions of the device 10. The view "Y-Y" is a cross-sectional view taken through the GAA gate structure 11 in a direction that is parallel to the long axis of the GAA gate structure 11, i.e., in the gate width direction of the device 10.

The view "Z-Z" is a cross-sectional view taken along the long axis of the nanowires 14 and through the GAA gate structure 11. It should be understood that FIG. 1A is only provided to show the location of the various cross-sectional views depicted in the drawings below, and many aspects discussed below are not depicted in FIG. 1A so as to not overly complicate the device 10 depicted in FIG. 1A.

Figure 1B:
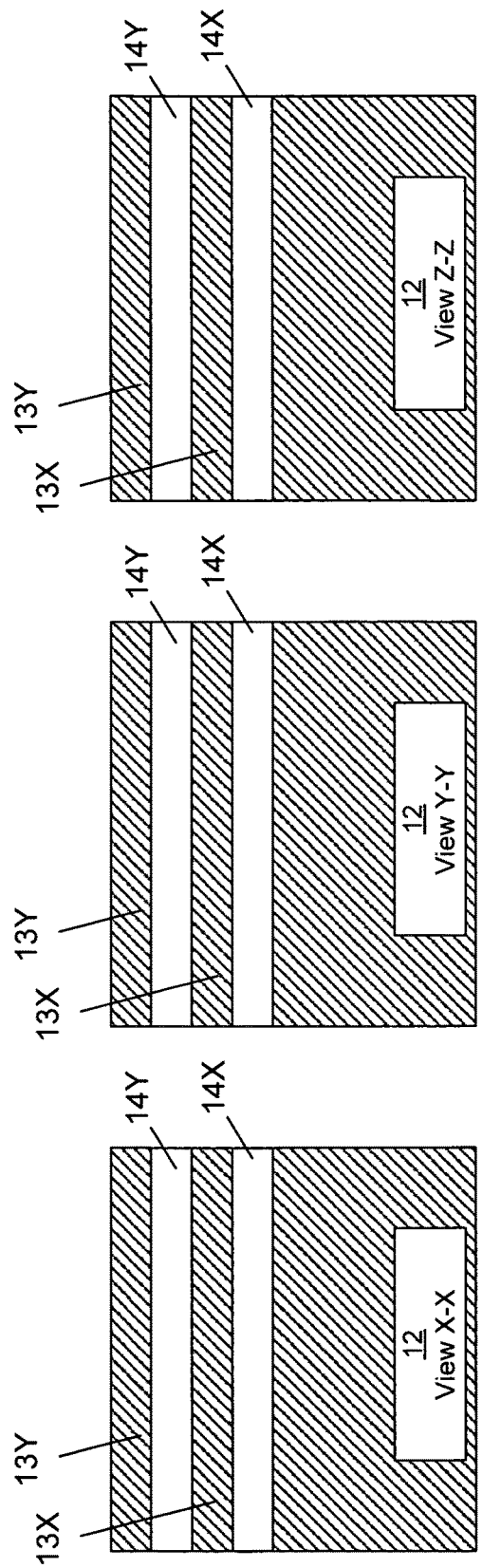
Figure 1C:
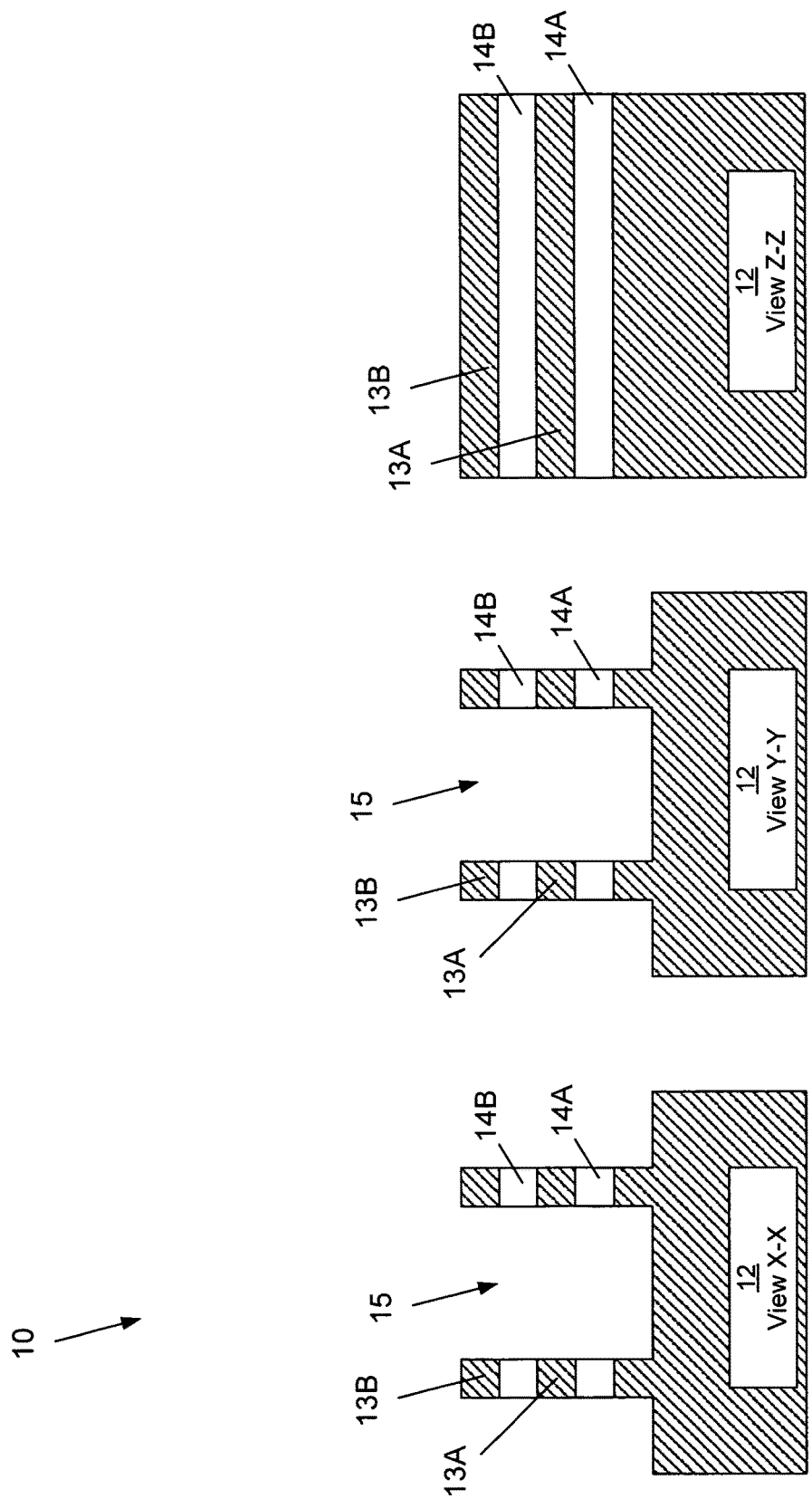

As an initial matter, the nanowire structures 14 will be formed above the substrate 12. There are many possible process flows that may be used to form the nanowire structures 14. Thus, the presently disclosed inventions should not be considered to be limited to any particular method that is employed to manufacture the nanowire structures 14. FIGS. 1B-1C depict one illustrative process flow for initially forming the nanowire structures 14.

FIG. 1B depicts the device 10 after alternating layers of semiconductor material 14X, 13X, 14Y and 13Y are formed above the substrate 12 by performing known epitaxial growth processes. In general, the layers of material 13X, 13Y are made of a first semiconductor material, while the layers 14X, 14Y are made of a second semiconductor material that is different from the first semiconductor material. In general, the first and second semiconductor materials are selected such that the layers 13X, 13Y may be selectively removed (by etching) relative to the layers 14X, 14Y. For example, in one illustrative embodiment, the layers 13X, 13Y may be layers of silicon while the layers 14X, 14Y may be layers of silicon-germanium or pure germanium. In some cases, the layers 13X, 13Y may be made of the same material as that of the substrate 12, e.g., silicon, but such a situation is not required in all applications. The layers of material 14X, 13X, 14Y and 13Y may be of any desired thickness and they need not all have the same thickness, although that configuration may be appropriate in some applications. The layers 14X, 13X, 14Y and 13Y may be made of any type of semiconductor material, e.g., silicon, germanium, silicon-germanium a III-V material (or alloys or combinations thereof) as long as the material(s) selected for the semiconductor layers 13X, 13Y may be selectively etched relative to the material(s) selected for the layers 14X, 14Y. In one particular embodiment, the substrate 12 and the layers 13X, 13Y may be made of silicon, while the layers 14X, 14Y may be made of silicon-germanium, e.g., $Si_{0.5}Ge_{0.5}$, $Si_{0.25}Ge_{0.25}$, etc. In one illustrative embodiment, each of the layers 14X, 13X, 14Y and 13Y may be formed so as to be substantially dopant free, i.e., substantially free of N or P type dopants, at this point in the process flow. It should be noted that when the term "substantially dopant free" or "substantially un-doped" is used in the specification or in the claims with reference to the nanowire structures, is should be understood to mean that, at this particular point in the process, the nanowire structures do not have a sufficient quantity of N or P type source/drain dopant materials (depending upon the type of device under construction) that would enable the nanowire device to function as an operational source/drain region for the device. It should be noted that when the term "entirely dopant free" or "entirely un-doped" is used in the specification or in the claims with reference to the nanowire structures, is should be understood to mean that, at this particular point in the process, the nanowire structures have at most only a trace amount of N or P type source/drain dopant materials, i.e., less than $1 \times 10^{17}$ atoms/cm$^3$.

FIG. 1C depicts the device 10 after one or more etching processes, such as a dry or wet etching process, were performed through a patterned mask layer (not shown) to form a plurality of trenches 15 that, in the depicted example, extend into the substrate 12. This process operation results in the definition of a plurality of vertically stacked nanowires 14A, 14B, 13A, 13B. The overall size, shape and configuration of the trenches 15 and the stacked nanowires may vary depending on the particular application. In the illustrative example depicted in the attached drawings, the trenches 15 and the stacked nanowires are all of a uniform size and shape. However, as discussed more fully below, such uniformity in the size and shape of the trenches 15 and the stacked nanowires is not required to practice at least some aspects of the inventions disclosed herein. In the example depicted herein, the trenches 15 are formed by performing an anisotropic etching process that results in the trenches 15 having a schematically depicted, generally rectangular configuration. In an actual real-world device, the sidewalls of the trenches 15 may be somewhat inwardly tapered, although that configuration is not depicted in the drawings. To the extent the trenches 15 are formed by performing a wet etching process, the trenches 15 may tend to have a more rounded configuration or non-linear configuration as compared to the generally rectangular configuration of the trenches 15 that are formed by performing an anisotropic etching process. Thus, the size and configuration of the trenches 15, and the manner in which they are made, should not be considered a limitation of the present invention. For ease of disclosure, only the substantially rectangular trenches 15 will be depicted in subsequent drawings.

Figure 1D:
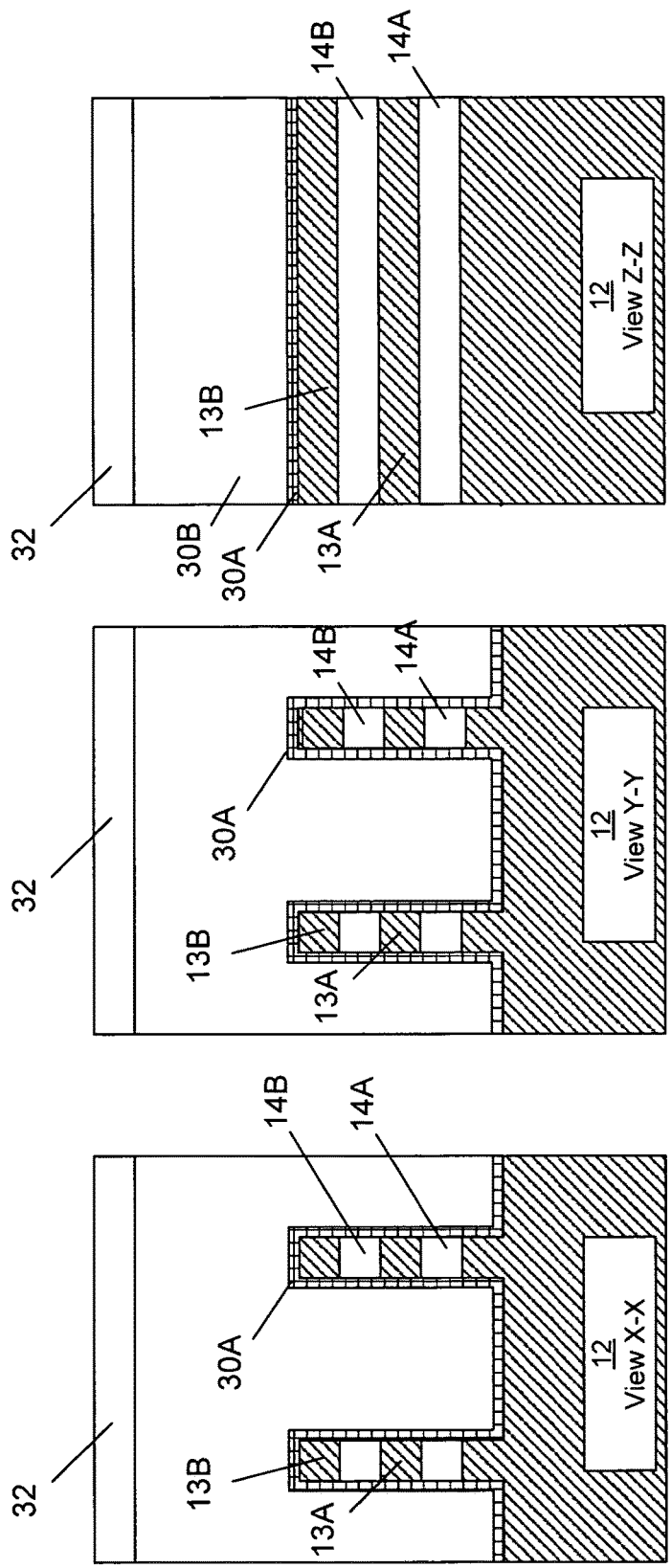
Figure 1E:
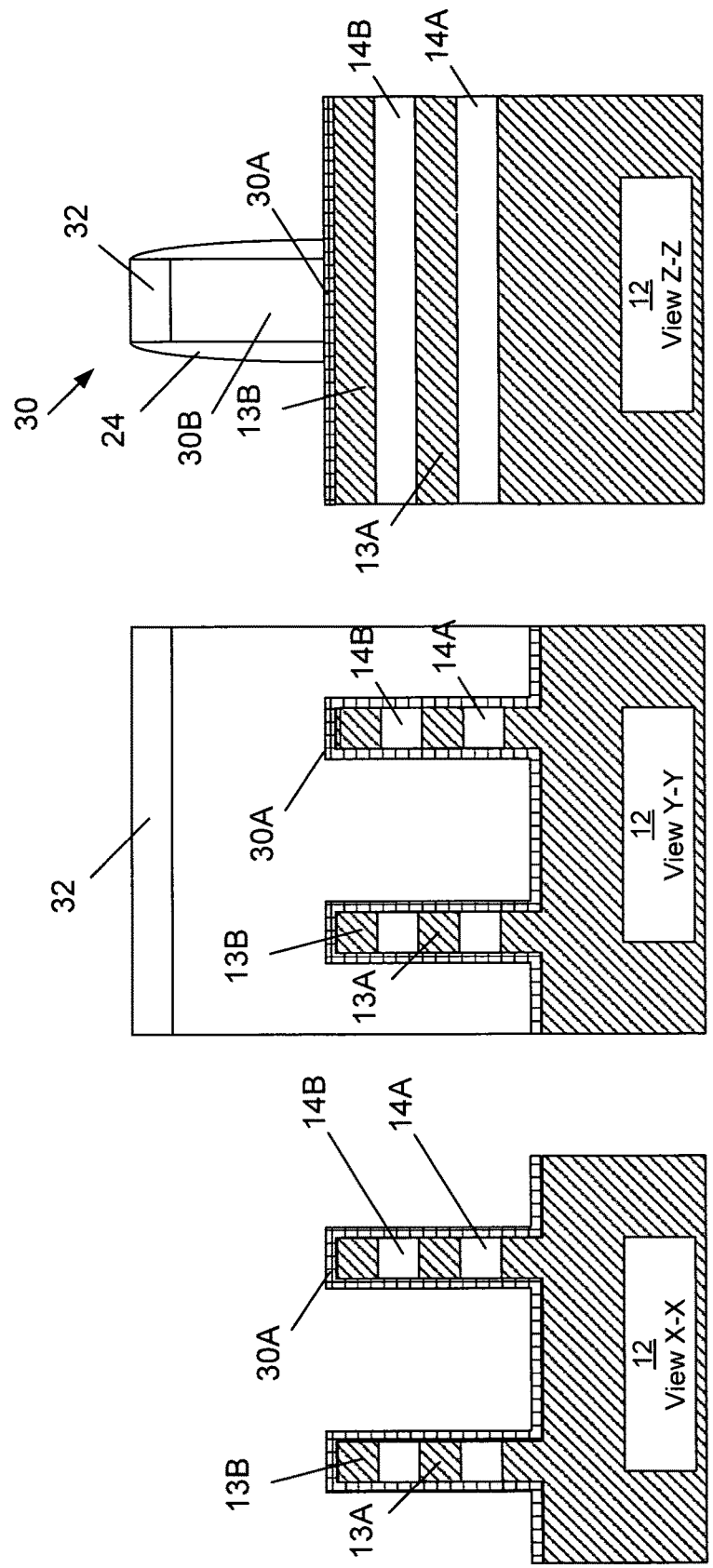

FIGS. 1D-1E depict various process operations that are performed to form a sacrificial gate structure 30 on the device 10. In one illustrative process flow, the hard mask layer that was used in the previous etching process that was performed to define the trenches 15 and the stacked nanowires 14A, 14B, 13A, 13B was removed, although removal of the hard mask may not be required in all applications. With continuing reference to FIG. 1D, the process begins with the formation of several layers of material above the substrate 12: a sacrificial gate insulation layer 30A, a sacrificial gate electrode layer 30B and a hard mask layer 32. Such layers may be formed using a variety of different materials and by performing a variety of known techniques. For example, the sacrificial gate insulation layer 30A may be comprised of silicon dioxide, the sacrificial gate electrode layer 30B may be comprised of polysilicon or amorphous silicon and the mask layer 32 may be comprised of silicon nitride. The sacrificial gate insulation layer 30A, sacrificial gate electrode layer 30B and the mask layer 32 may be of any desired thickness or configuration. Moreover, the mask layer 32 could be comprised of multiple layers of material, such as, for example, a combination of a silicon nitride layer and a layer of silicon dioxide. Thus, the particular form and composition of the mask layer 32 and the manner in which it is made should not be considered a limitation of the present invention. The layers of material depicted herein may be formed by any of a variety of different known techniques, e.g., a chemical vapor deposition (CVD) process, an atomic layer deposition (ALD) process, a thermal growth process, etc.

As shown in FIG. 1E, one or more patterning and etching processes are performed to define the sacrificial gate electrode 30B and the gate cap layer 32. Typically, the mask layer 32 is patterned using known photolithography and etching techniques to thereby define a patterned mask layer. Alternatively, the mask layer 32 may be patterned using known sidewall image transfer techniques. Thereafter, one or more etching processes are performed through the patterned mask layer to remove exposed portions of the sacrificial gate electrode layer 30A to thereby define the depicted sacrificial gate electrode 30B. With continuing reference to FIG. 1E, a sidewall spacer 24 (best seen in view "Z-Z") is formed adjacent the replacement gate electrode 30B. The spacer 24 may be formed by conformably depositing a layer of spacer material and thereafter performing an anisotropic etching process to define the sidewall spacers 24. The spacer 24 may be comprised of a variety of different materials, such as silicon nitride, silicon carbon nitride (SiCN), etc. Within the trenches 15, the sidewall spacer 24 does not form to any appreciable extent due to the relatively short height of the nanowires and the duration of the etching process.

Figure 1F:
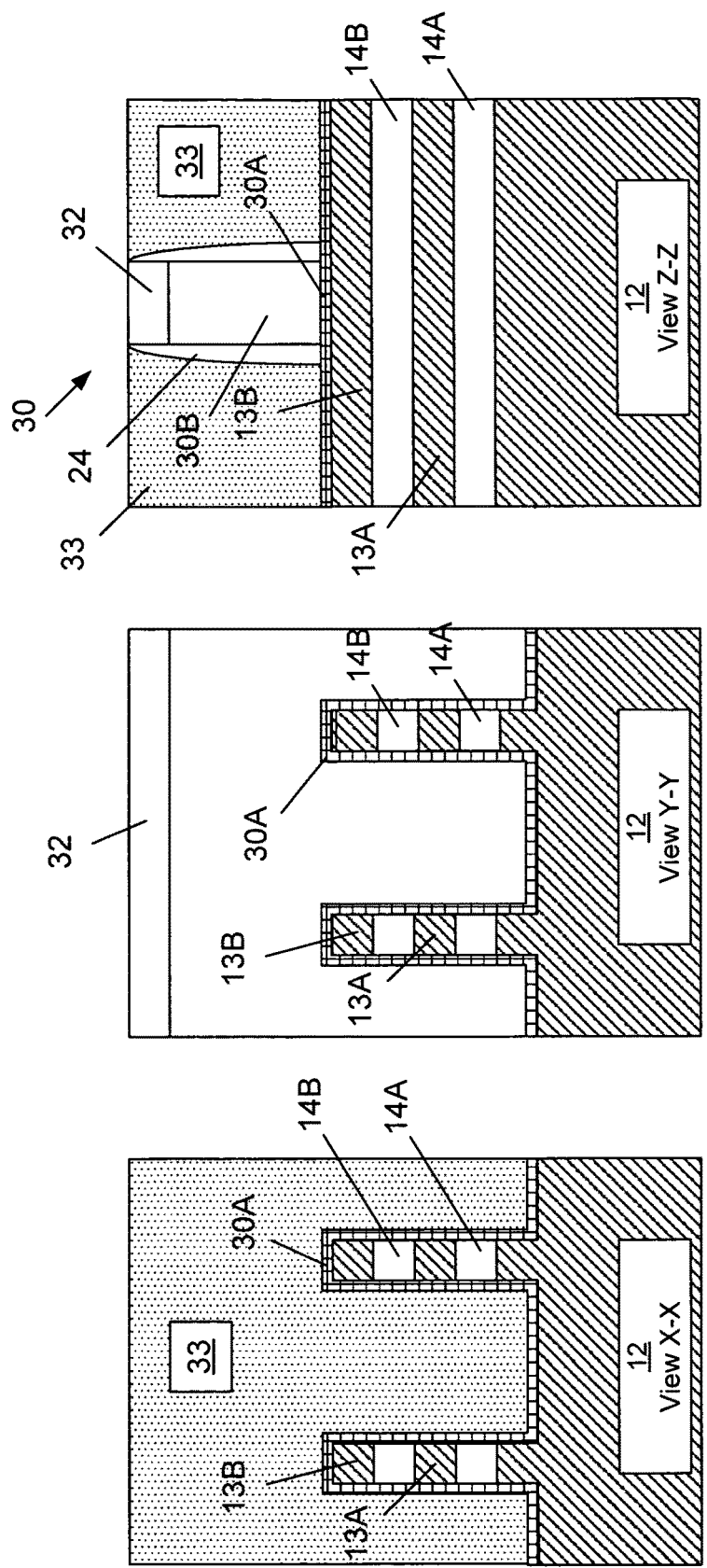
Figure 1G:
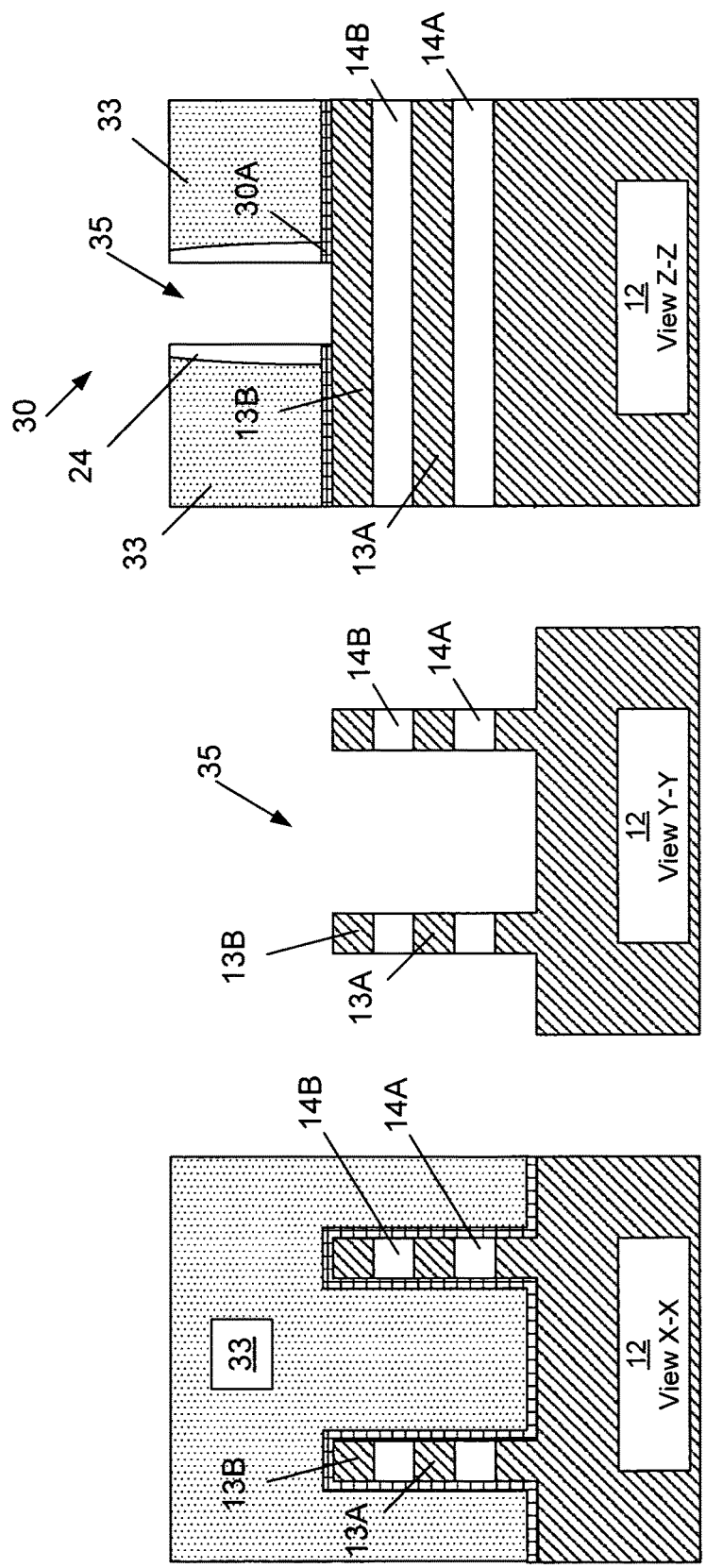

FIGS. 1F-1G depict the device 10 after several process operations were performed. First, a layer of insulating material 33 was blanket-deposited across the device 10. The layer of insulating material 33 may be comprised of a variety of different materials, such as silicon dioxide, etc., and it may be formed by performing a variety of techniques, e.g., chemical vapor deposition (CVD), etc. Thereafter, one or more chemical mechanical polishing (CMP) processes was performed to planarize the upper surface of the layer of material 33 using the gate cap layer 32 as a polish stop and continue to remove the gate cap layer 32. The removal of the gate cap layer 32 exposes the upper surface of the sacrificial gate electrode 30B for further processing. Then, as shown in FIG. 1G, one or more etching processes were performed to remove the sacrificial gate electrode 30B (see FIG. 1F) and the sacrificial gate insulation layer 30A to thereby define a gate cavity 35 that is laterally defined by the spacer 24 and thereby expose the portions of the nanowires 14A, 14B, 13A, 13B that underlie the gate cavity 35.

Figure 1H:
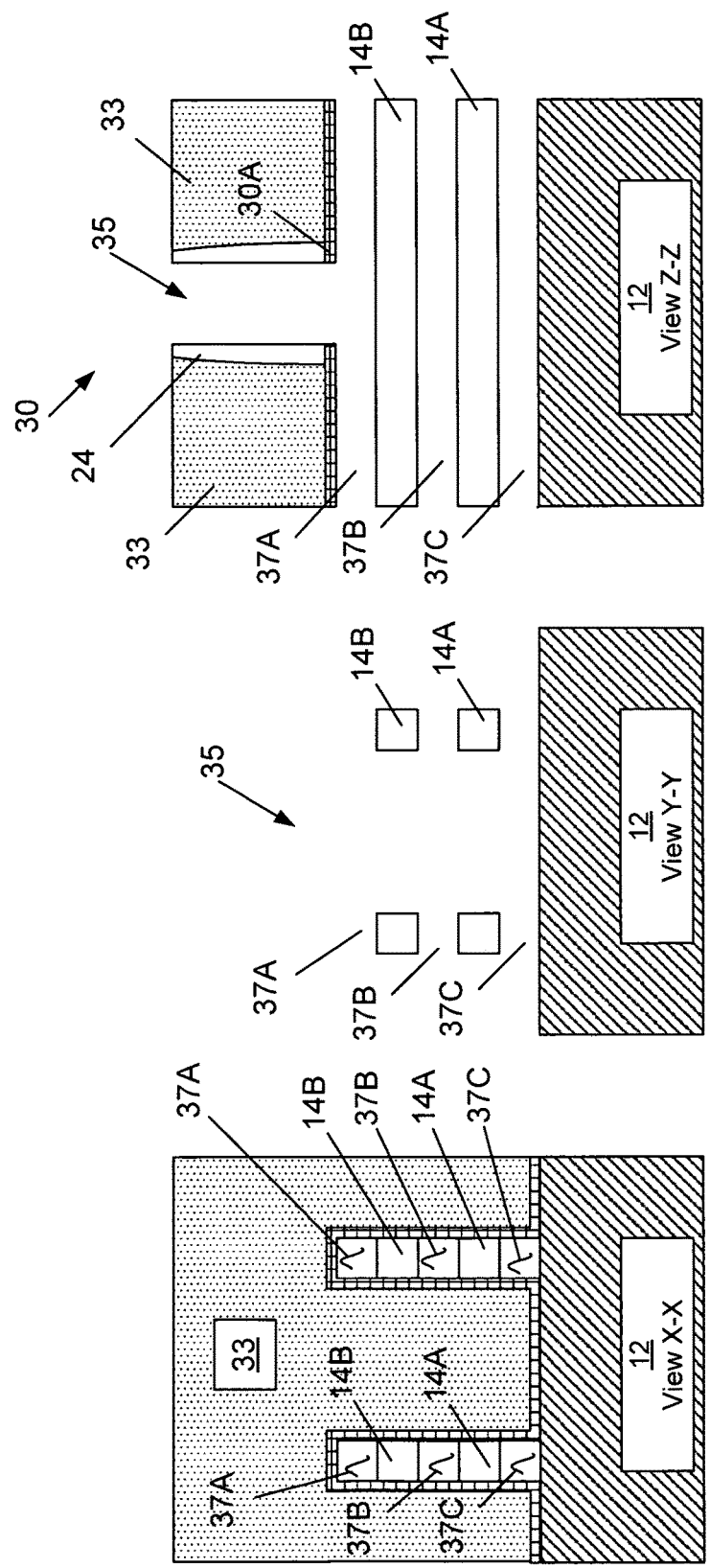

FIG. 1H depicts the device 10 after a wet etching process was performed through the gate cavity 35 to selectively remove the nanowires 13A, 13B and portions of the substrate 12 selectively relative to the nanowires 14A, 14B. This process operation results in the formation of gaps 37A, 37B and 37C that extend for approximately the entire axial length of the nanowires 14A, 14B. As depicted, the portions of the nanowires 14A, 14B under the gate cavity 35 are free of any additional materials at this point in the process flow. Note that the nanowires 14A, 14B are supported by the insulating material 33 during and at the completion of the selective etching process that is performed to remove the nanowires 13A, 13B and portions of the substrate 12. Also note that, in this particular example, the nanowires 13A, 13B are made of the same material as the substrate 12, e.g., silicon. Thus, a single etching process may be performed to remove those structures. In other applications, two or more etching processes may be required to remove the nanowires 13A, 13B and portions of the substrate 12 if the nanowires 13A, 13B and portions of the substrate 12 are made of different materials.

Figure 1I:
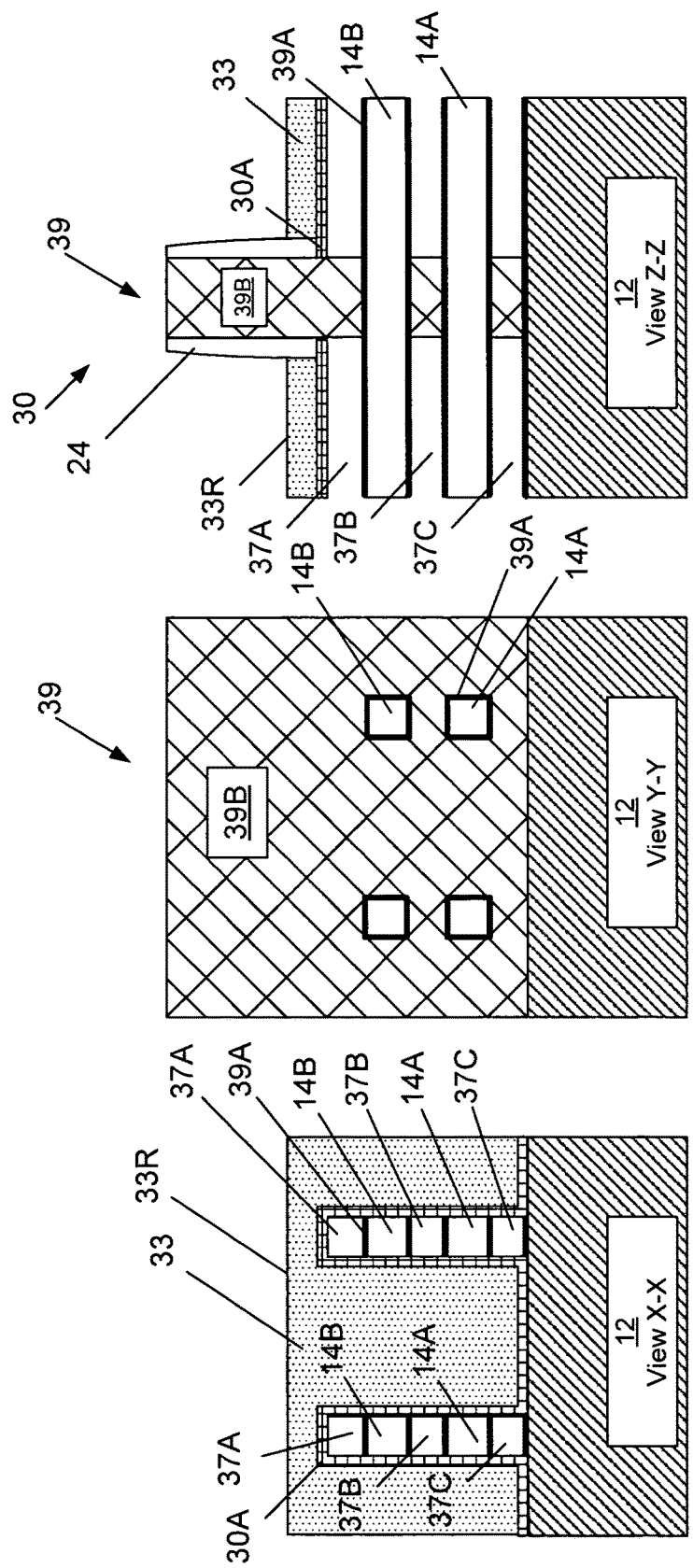

FIG. 1I depicts the device 10 after various process operations were performed. First, a second sacrificial gate structure 39 was formed on the device 10. The second sacrificial gate structure 39 is in the form of a gate-all-around (GAA) gate structure and it is comprised of a sacrificial gate insulation layer 39A, and a sacrificial gate electrode layer 39B, which may be formed using a variety of different materials and by performing a variety of known techniques. For example, the sacrificial gate insulation layer 39A may be comprised of a thermally grown layer of silicon dioxide, while the sacrificial gate electrode layer 39B may be comprised of polysilicon or amorphous silicon. As depicted, the thermally grown layer of silicon dioxide 39A covers substantially the entire axial length of the nanowires 14A, 14B. Once the gate cavity 35 is overfilled with the gate electrode 39B material, a CMP process may be performed to remove excess portions of the gate electrode 39B material using the layer of insulating material 33 as a polish stop. Thereafter, a recess etching process was performed on the layer of insulating material 33 such that it has a recessed upper surface 33R. The amount of the recessing of the layer of insulating material 33 may vary depending upon the particular application.

Figure 1J:
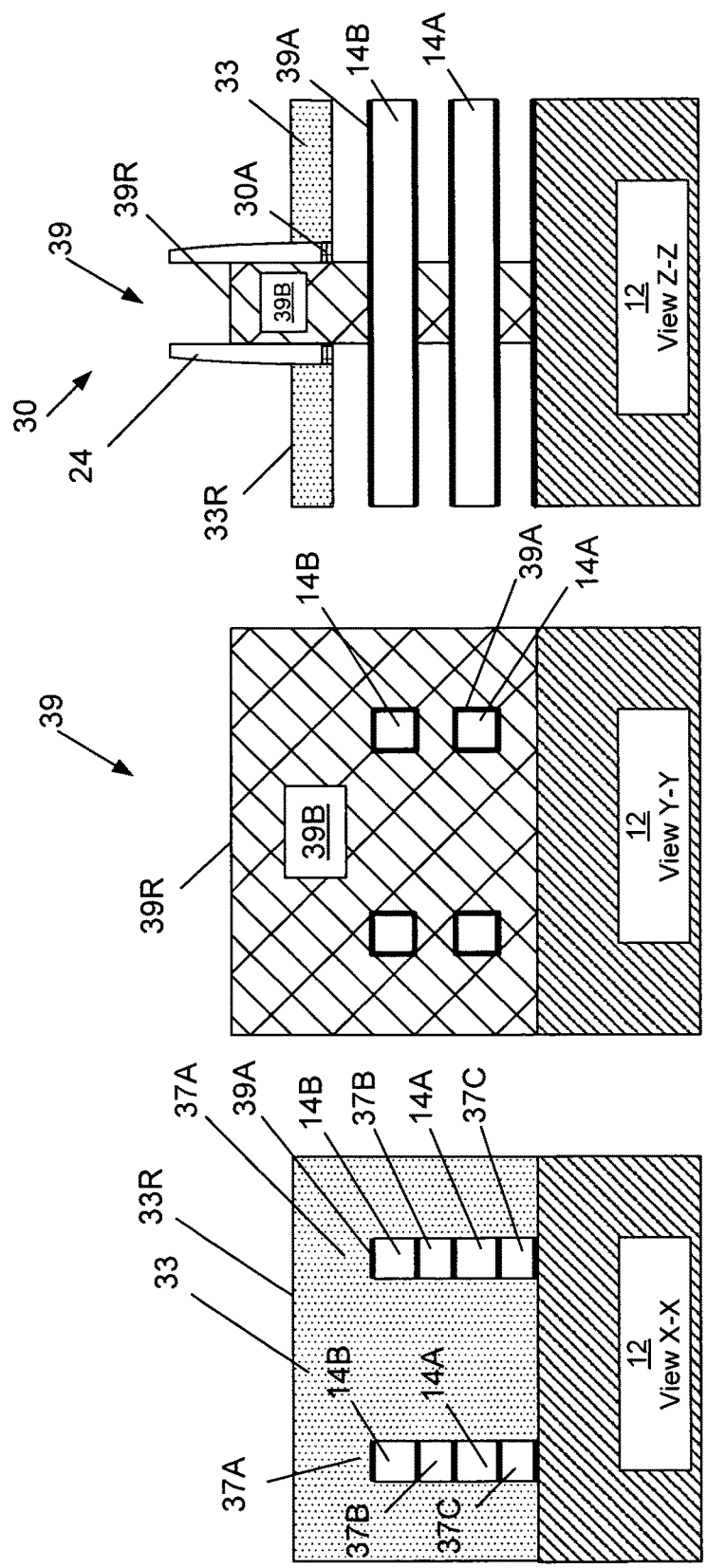

FIG. 1J depicts the device 10 after a recess etching process was performed on the gate electrode 39B material such that is has a recessed upper surface 39R. The amount of the recessing of the gate electrode 39B material may vary depending upon the particular application.

Figure 1K:
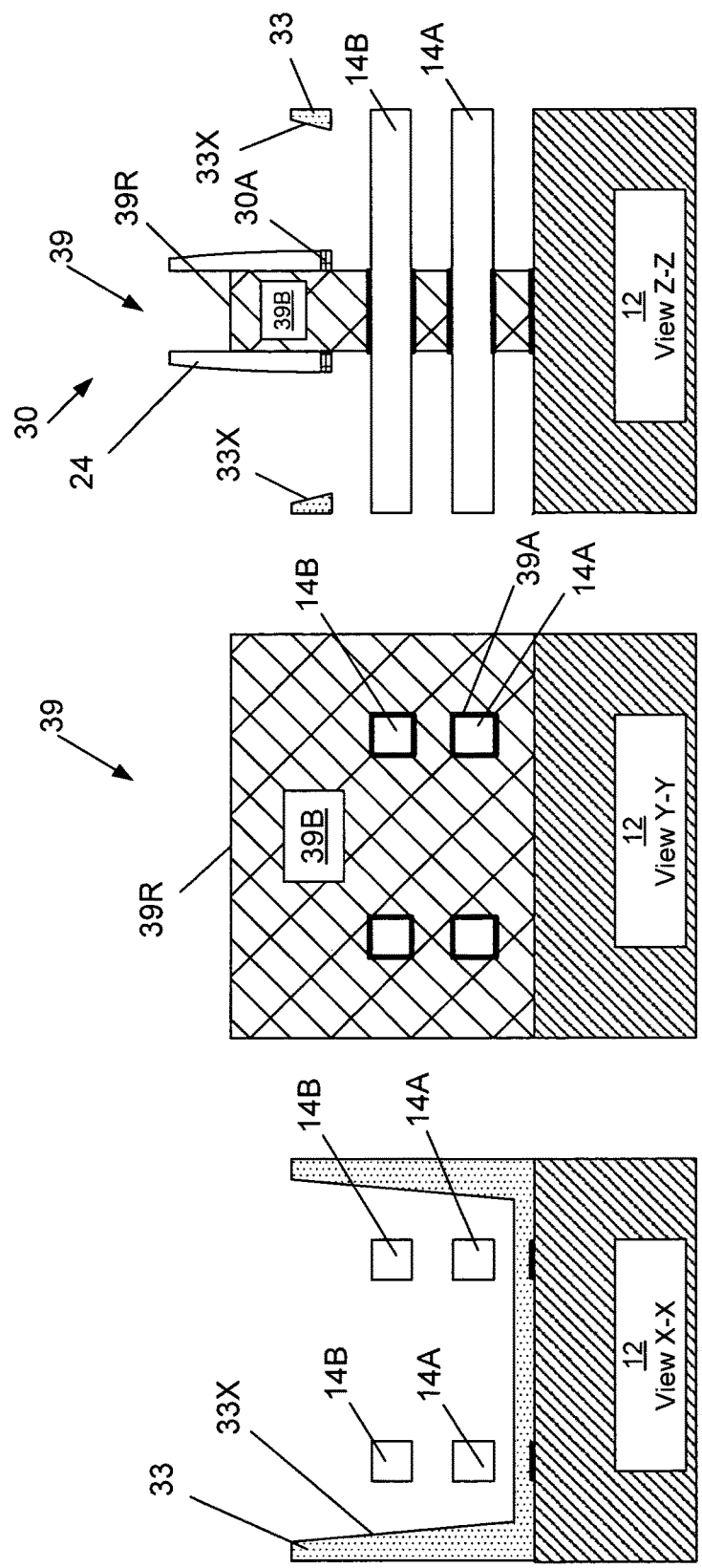

FIG. 1K depicts the device 10 after the layer of insulating material 33 was patterned using traditional photolithography and etching techniques to define openings 33X that expose the portions of the nanowires 14A, 14B positioned in the source/drain regions of the device 10. The etching processes that were performed to define the opening 33X also remove portions of the sacrificial gate insulation layer 30A and the sacrificial gate insulation layer 39A from within the opening 33X thereby removing such materials from the exposed portions of the nanowires 14A, 14B in the source/drain region of the device 10. At this point in the process flow, one or more ion implantation processes may be performed to form N or P type doped regions (not shown) in the exposed substantially dopant free nanowires 14A, 14B. Thereafter an anneal process was performed to activate the implanted dopant atoms.

Figure 1L:
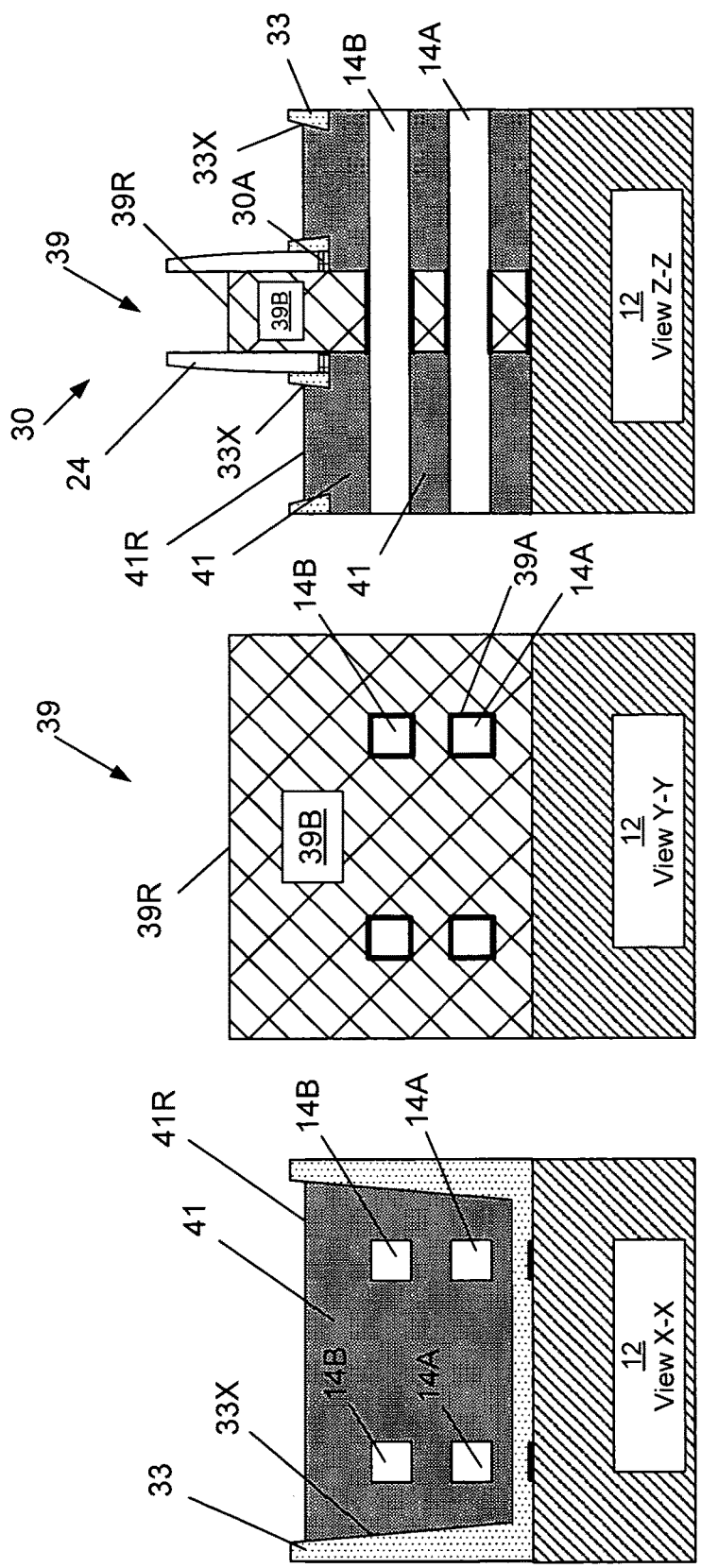

FIG. 1L depicts the device 10 after several process operations were performed. First, the patterned masking layer that was used to pattern the layer of insulating material 33 was removed. Thereafter, a metal-containing layer 41, e.g., a layer of tungsten, copper, titanium, titanium nitride, aluminum, gold, silver, etc. (including alloys thereof) was blanket-deposited across the substrate 12. One or more barrier layers (not shown) may be formed prior to the formation of the metal-containing layer 41. Thereafter, a recess etching process was performed on the metal-containing layer 41 such that it has a recessed upper surface 41R that is below the upper surface of the layer of insulating material 33. The amount of the recessing may vary depending upon the particular application. This results in the formation of metal conductive source/drain contact structures 41 that are positioned all around the nanowires 14A, 14B positioned in the source/drain regions of the device 10. It should be noted that, as used herein and in the attached claims, the term "metal conductive source/drain contact structures" shall include any associated barrier metals (if present). By providing these metal conductive source/drain contact structures 41 all around the nanowires 14A, 14B, good electrical contact may be established with the nanowires 14A, 14B in the source/drain regions using a relatively low-resistance (high conductivity) material, thereby enhancing the performance of the device 10.

Figure 1M:
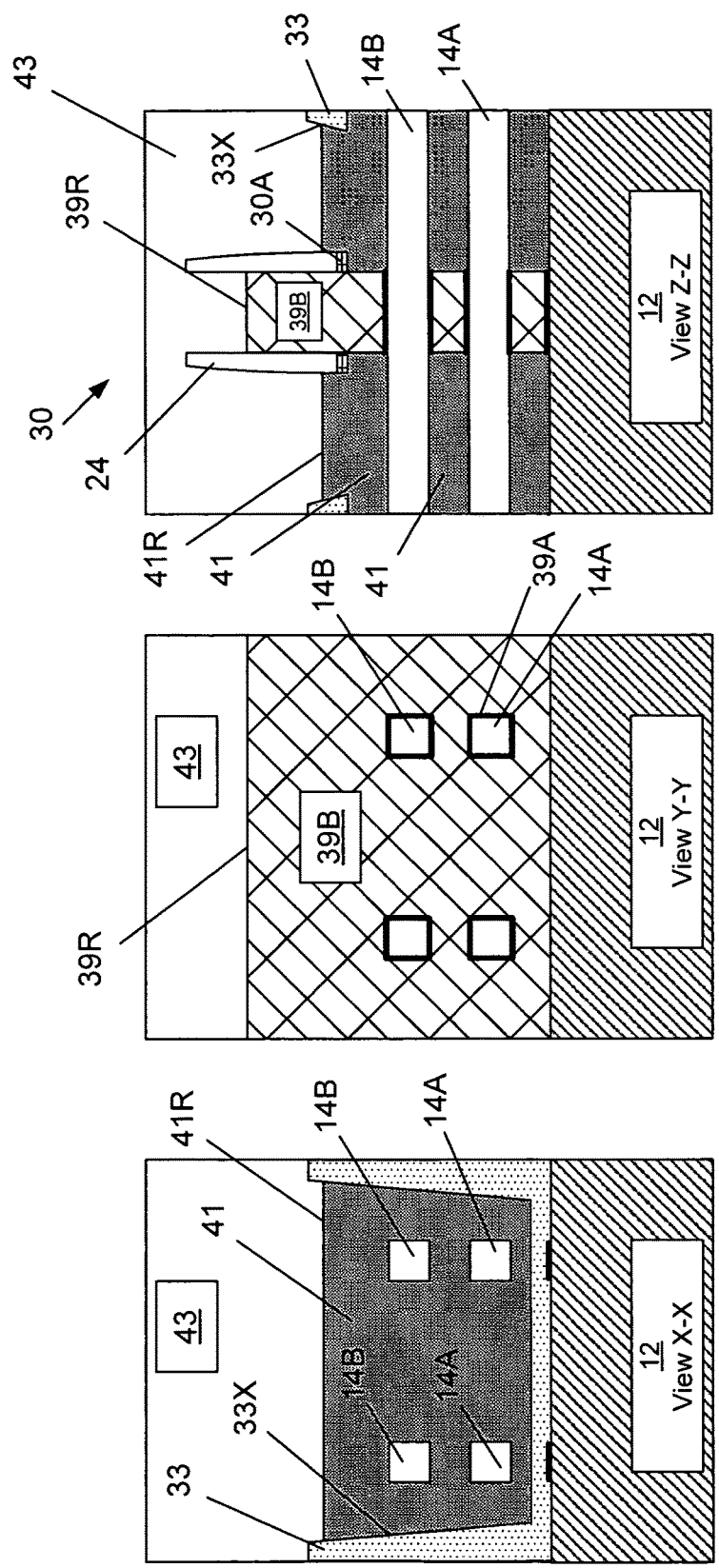

FIG. 1M depicts the device 10 after a hard mask layer 43 was blanket-deposited across the substrate 12 and after a CMP process was performed to planarize its upper layer. The hard mask layer 43 may be comprised of a variety of materials such as, for example, silicon nitride. Moreover, the hard mask layer 43 could be comprised of multiple layers of material, such as, for example, a combination of a silicon nitride layer and a layer of silicon dioxide. Thus, the particular form and composition of the mask layer 43 and the manner in which it is made should not be considered a limitation of the present invention.

Figure 1N:
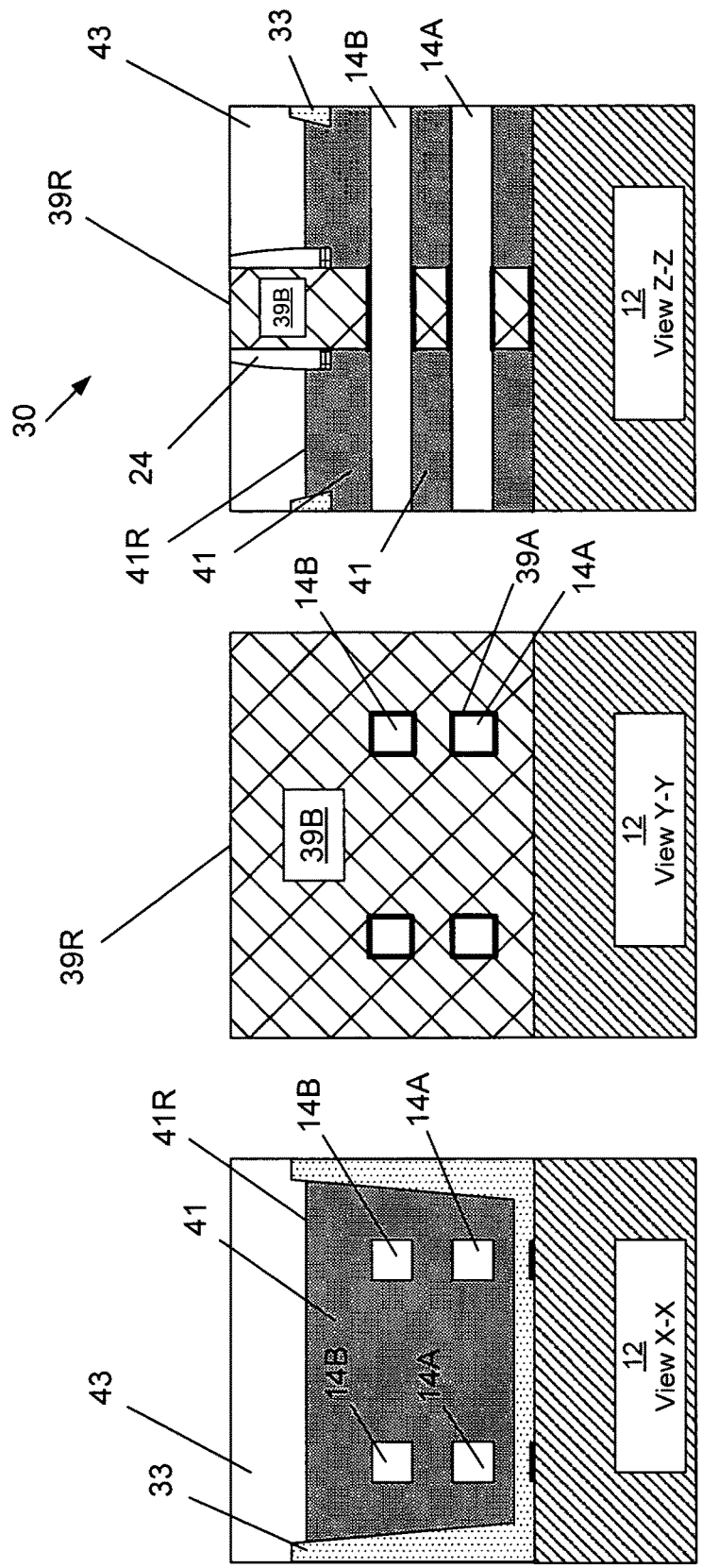
Figure 10:
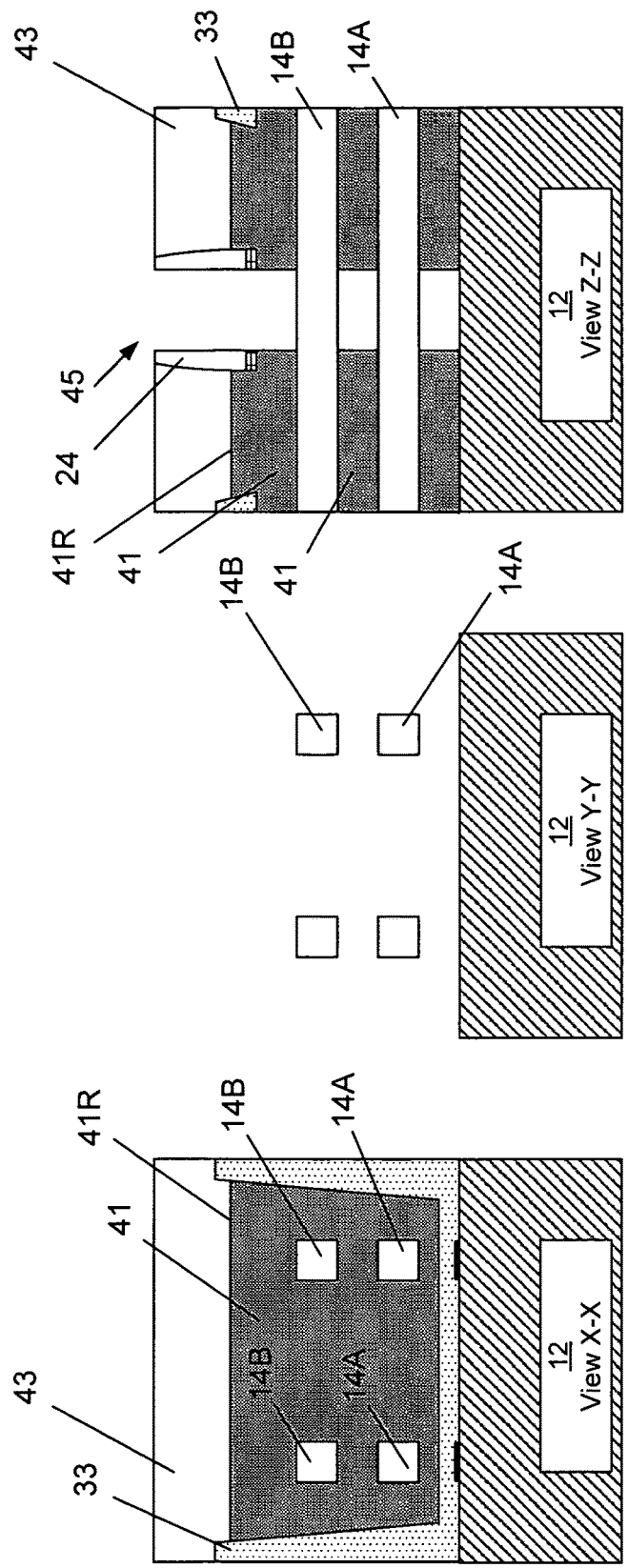

FIG. 1N depicts the device 10 after a CMP process was performed on the hard mask layer 43 using the sacrificial gate electrode material 39B as a polish stop. This exposes the sacrificial gate electrode 39B for further processes and leaves the hard mask material 43 positioned above the metal conductive source/drain contact structures 41.

FIG. 1O depicts the device 10 after one or more etching processes were performed to remove the sacrificial gate electrode 39B (see FIG. 1N) and the sacrificial gate insulation layer 39A to thereby define a gate cavity 45 that is laterally defined by the spacer 24 and thereby expose the portions of the nanowires 14A, 14B that underlie the gate cavity 45 and side surfaces of the metal conductive source/drain contact structures 41. Note that the hard mask layer 43 protects the metal conductive source/drain contact structures 41 during this etching process.

Figure 1P:
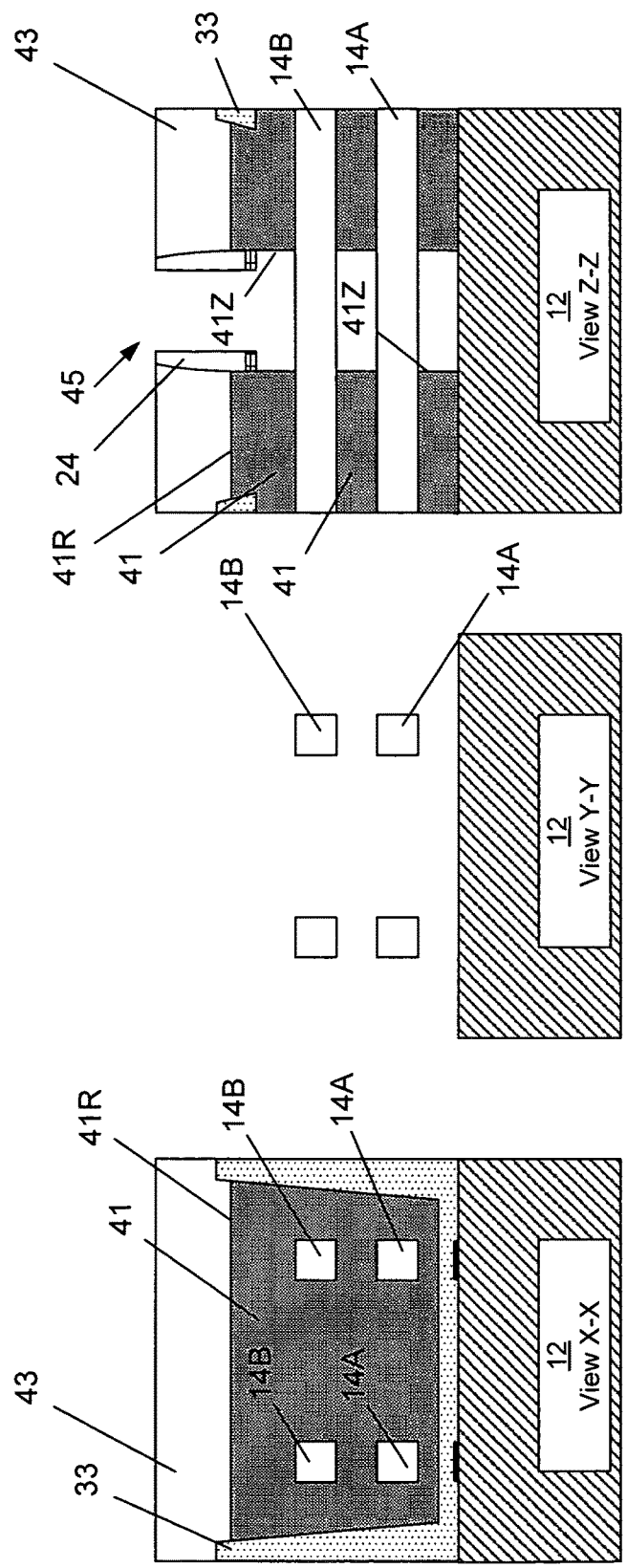

FIG. 1P depicts the device 10 after a recess etching process was performed through the gate cavity 45 on the metal conductive source/drain contact structures 41 to recess the side surfaces 41Z of the metal conductive source/drain contact structures 41. The amount of the recessing may vary depending upon the particular application.

Figure 1Q:
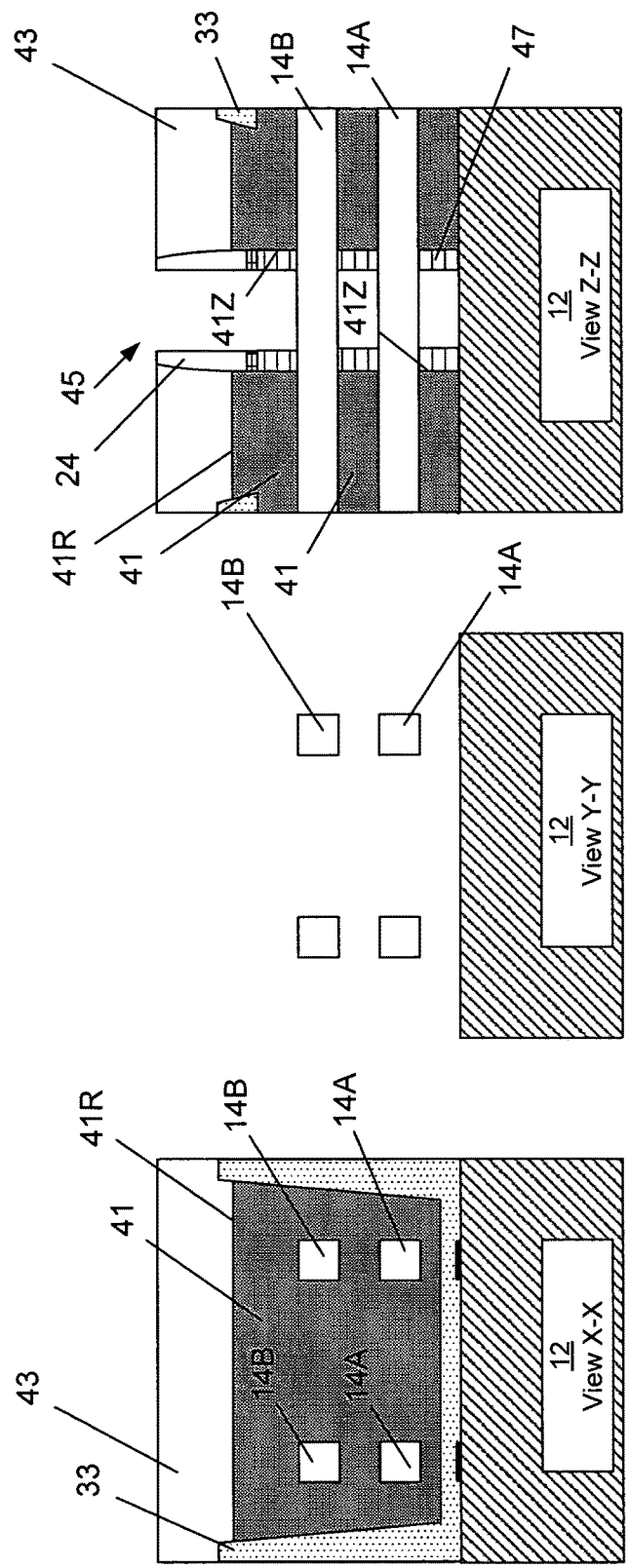

FIG. 1Q depicts the device 10 after an insulating material 47, such as silicon dioxide, was formed in the areas that were previously occupied by the recessed portions of the metal conductive source/drain contact structures 41. The regions of insulating material 47 were formed by performing a deposition process through the gate cavity 45 so as to essentially over-fill (in a lateral sense) the areas that were previously occupied by the recessed portions of the metal conductive source/drain contact structures 41 and thereafter performing an anisotropic etching process through the gate cavity 45 to remove portions of the insulating material 47. These process operations result in the formation of the regions of insulating material 47 that are substantially self-aligned with respect to the inward sidewalls of the spacer 24. The nanowires 14A, 14B in the channel region of the device are also cleared of all extraneous materials at this point in the process flow.

Figure 1R:
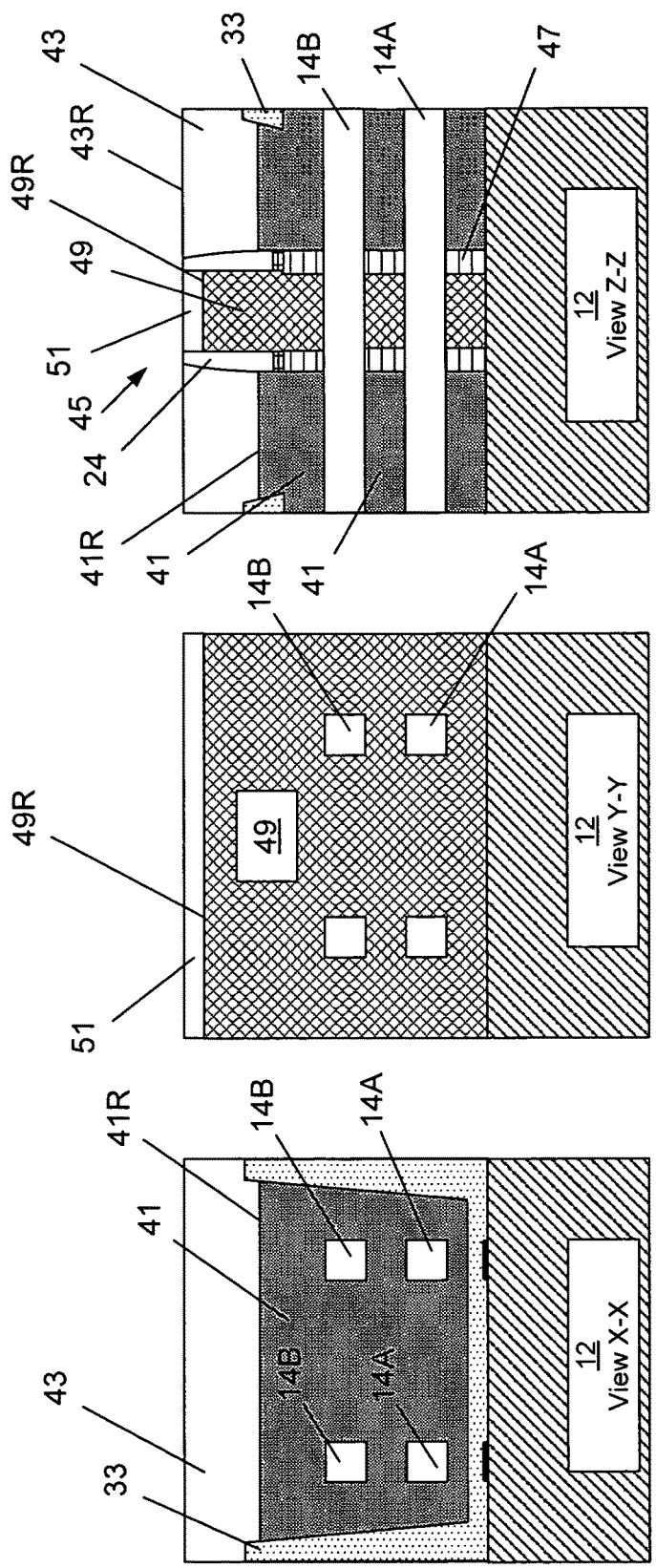

At this point in the process flow, as shown in FIG. 1R, a simplistically depicted final gate-all-around (GAA) gate structure 49 for the device 10 is formed in and around the exposed nanowires 14A, 14B and within the gate cavity 45. The final gate structure 49 comprises a gate insulation layer (not separately shown) and one or more layers of conducting materials (not separately shown), such as metal layers, which will serve as the gate electrode of the gate structure 49. For example, the gate insulation layer of the final gate structure 49 may be formed on and around the exposed nanowires 14A, 14B and within the gate cavity 45 by performing, for example, a CVD process. The final gate insulation layer may be comprised of a variety of different materials, such as, for example, a so-called high-k (k greater than 10) insulation material (where k is the relative dielectric constant), etc. The thickness of the gate insulation layer may also vary depending upon the particular application, e.g., it may have a thickness of about 2-5 nm. The thickness of the gate insulation layer and the size of the nanowires 14A, 14B are controlled such that the gate insulation layer does not fill all of the gap between the nanowires 14A, 14B and the gap between the nanowire 14A and the substrate 12, thereby leaving room for formation of the layer or layers of conductive material that will constitute the conductive GAA gate electrode structure positioned around the entire outer surface of the nanowires 14A, 14B in the channel region of the device 10. The gate electrode portion of the final gate structure 49 may be comprised of one or more metal layers, e.g., TiN, TaN, W, Al, etc. As will be recognized by those skilled in the art after a complete reading of the present application, the final gate structure 49 of the device 10 depicted in the drawings, i.e., the gate insulation layer and the gate electrode, is intended to be representative in nature. The techniques used to form the final gate structure 49 within the gate cavity 45 are well known to those skilled in the art.

With continuing reference to FIG. 1R, after the materials for the final gate structure 49 were formed in the gate cavity 45, a CMP process operation was performed to remove excess portions of those materials from above the surface 43R of the hard mask layer 43. Thereafter, a recess etching process was performed on the materials of the final gate structure 49 such that it has a recessed upper surface 49R. This recessing operation is performed to make room for a protective gate cap layer. The amount of such recessing may vary depending upon the particular applications. Next, a layer (not shown) of gate cap material, such as a layer of silicon nitride, was deposited on the substrate and a CMP process was performed to remove excess material positioned outside of the gate cavity, thereby resulting in the formation of a gate cap layer 51 that is positioned above the recessed upper surface 49R of the final gate structure 49.

Figure 1S:
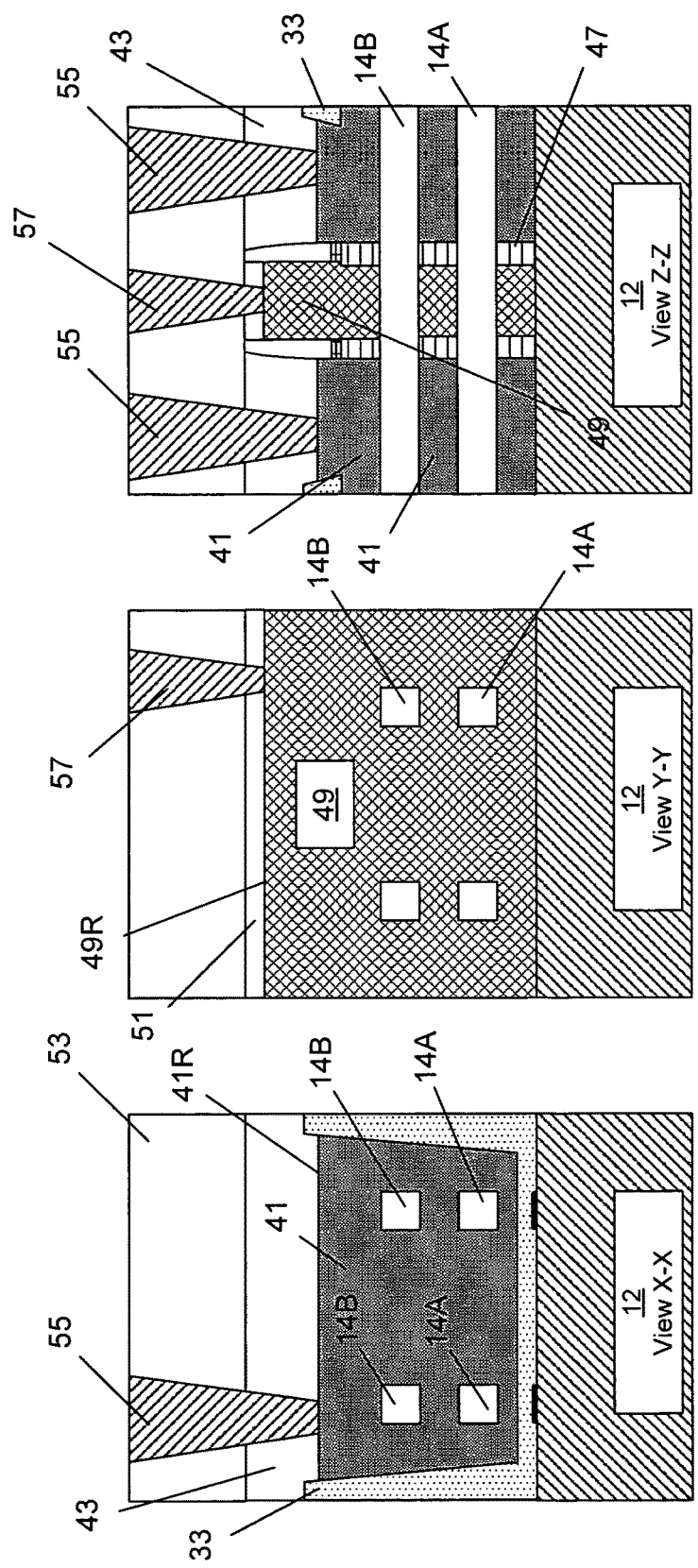

FIG. 1S depicts the device 10 after traditional manufacturing processes were performed to form source/drain contact structures 55 and a gate contact structure 57 on the device 10. In one illustrative process flow, a layer of insulating material 53, e.g., silicon dioxide was blanket-deposited across the substrate 12. In some applications, the openings in the layer of insulating material 53 for the source/drain contact structures 55 may be formed prior to the formation of the opening for the gate contact structure 57 (or vice-versa). Thereafter, all of the openings are filled with an appropriate contact metal, such as tungsten, and perhaps one or more barrier layers (not shown). In other applications, all of the openings for the source/drain contact structures 55 and the gate contact structure 57 may be formed at the same time and subsequently filled with conductive material. The contact openings in the layer of insulating material may be formed using known etching and photolithography techniques. The overall size and shape of the source/drain contact structures 55 and the gate contact structure 57 may vary depending upon the particular application, and they need not be the same. As depicted, the source/drain contact structures 55 are conductively coupled to the metal conductive source/drain contact structures 41, while the gate contact structure 57 is conductively coupled to the final gate structure 49. Also note that the source/drain contact structures 55 and the gate contact structure 57 may not be positioned in the same plane as simplistically depicted in view Z-Z of FIG. 1S.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a nanowire device comprising multiple nanowires, a channel region and a plurality of source/drain regions, the method comprising:

forming a plurality of stacked substantially un-doped nanowire structures above a semiconductor substrate, said plurality of stacked substantially un-doped nanowire structures comprising a first plurality of nanowires made of a first semiconductor material and a second plurality of nanowires made of a second semiconductor material that is different than said first semiconductor material;

forming a sacrificial structure around said plurality of stacked substantially un-doped nanowire structures at a location that corresponds to said channel region of said device;

forming a layer of insulating material above and adjacent said plurality of stacked substantially un-doped nanowire structures and proximate said sacrificial structure;

removing said sacrificial structure to define a cavity that exposes said plurality of stacked substantially un-doped nanowire structures within said cavity;

performing a selective etching process through said cavity to remove said second plurality of nanowires from said channel region and said source/drain regions of said device while leaving said first plurality of nanowires in position;

forming a metal conductive source/drain contact structure in each of said source drain regions, wherein each of said metal conductive source/drain contact structures is positioned all around said first plurality of nanowires positioned in said source/drain region; and forming a gate all around gate structure that is positioned all around each of said first plurality of nanowires positioned in said channel region of said device.

2. The method of claim 1, wherein said plurality of stacked substantially un-doped nanowire structures have one of a circular, elliptical, rectangular or square cross-sectional configuration in a cross-section taken through said plurality of stacked substantially un-doped nanowire structures in a direction that is perpendicular to a direction of current transport in said device when it is operational.

3. The method of claim 1, wherein said plurality of stacked substantially un-doped nanowire structures are entirely dopant free nanowire structures.

4. The method of claim 1, wherein, prior to forming said metal conductive source/drain contact structures, the method comprises:
   forming an opening in at least said layer of insulating material so as to expose said first plurality of nanowire structures in said source/drain regions of said device; and
   performing at least one ion implantation process to introduce one of a P-type or N-type dopant material into said exposed said first plurality of nanowire structures in said source/drain regions of said device.

5. The method of claim 1, wherein said first semiconductor material is silicon-germanium and said second semiconductor material is silicon.

6. The method of claim 1, wherein said second semiconductor material is a semiconductor material that is the same as said semiconductor substrate.

7. The method of claim 1, wherein said sacrificial structure is a first sacrificial gate structure.

8. The method of claim 1, wherein said gate all around gate structure comprises a gate insulation layer comprised of a high-k insulating material that is positioned all around each of said first plurality of nanowires positioned in said channel region of said device and a gate electrode comprised of at least one layer of metal positioned all around said gate insulation layer.

9. The method of claim 1 wherein said first plurality of nanowires comprise at least two nanowires and said second plurality of nanowires comprise at least two nanowires.

10. The method of claim 1, wherein said metal conductive source/drain contact structure comprises at least one of tungsten, copper, titanium, titanium nitride, aluminum, gold or silver or alloys thereof.

11. A method of forming a nanowire device comprising multiple nanowires, a channel region and a plurality of source/drain regions, the method comprising:
   forming a plurality of stacked substantially un-doped nanowire structures above a semiconductor substrate, said plurality of stacked substantially un-doped nanowire structures comprising a first plurality of nanowires made of a first semiconductor material and a second plurality of nanowires made of a second semiconductor material that is different than said first semiconductor material;
   forming a sacrificial structure around said plurality of stacked substantially un-doped nanowire structures at a location that corresponds to said channel region of said device;
   forming a layer of insulating material above and adjacent said plurality of stacked substantially un-doped nanowire structures and proximate said sacrificial structure;
   removing said sacrificial structure to define a cavity that exposes said plurality of stacked substantially un-doped nanowire structures within said cavity;
   performing a selective etching process through said cavity to remove said second plurality of nanowires from said channel region and said source/drain regions of said device while leaving said first plurality of nanowires in position;
   after performing said selective etching process, forming an opening in at least said layer of insulating material so as to expose said first plurality of nanowires in said source/drain regions of said device;
   performing at least one ion implantation process through said opening in said layer of insulating material to introduce one of a P-type or N-type dopant material into said exposed said first plurality of nanowires in said source/drain regions of said device;
   forming a metal conductive source/drain contact structure in each of said source drain regions, wherein each of said metal conductive source/drain contact structures is positioned all around said first plurality of nanowires positioned in said source/drain region; and
   forming a gate all around gate structure that is positioned all around each of said first plurality of nanowires positioned in said channel region of said device, wherein said gate structure comprises a high-k gate insulation layer and at least one layer of metal.

12. The method of claim 11, wherein said plurality of stacked substantially un-doped nanowire structures are entirely dopant free nanowire structures.

13. The method of claim 11, wherein, after performing said selective etching process and prior to forming said opening in at least said layer of insulating material, the method further comprises forming a gate-all-around sacrificial gate structure in said cavity, wherein said gate-all-around sacrificial gate structure is positioned all around each of said first plurality of nanowires in said channel region of said device.

14. The method of claim 13, wherein forming said metal conductive source/drain contact structures comprises forming said metal source/drain contact structures such that each of said metal source/drain contact structures contacts said gate-all-around sacrificial gate structure.

15. The method of claim 14, further comprising:
   removing said gate-all-around sacrificial gate structure to define a cavity that exposes a side surface of each of said metal conductive source/drain contact structures;
   performing a recess etching process through said cavity to remove a portion of each of said metal conductive source/drain contact structures; and
   forming insulating material in areas previously occupied by said removed portions of each of said metal conductive source/drain contact structures.

16. The method of claim 15, wherein, after forming said insulating material in said areas previously occupied by said removed portions of each of said metal conductive source/drain contact structures, the method further comprises forming said gate all around gate structure that is positioned all around each of said first plurality of nanowires positioned in said channel region of the device.

* * * * *